United States Patent [19]

Landingham

[11] Patent Number: 5,252,545
[45] Date of Patent: Oct. 12, 1993

[54] DENSE HIGH TEMPERATURE CERAMIC OXIDE SUPERCONDUCTORS

[75] Inventor: Richard L. Landingham, Livermore, Calif.

[73] Assignee: The United States of America as represented by the United States Department of Energy, Washington, D.C.

[21] Appl. No.: 73,241

[22] Filed: Jul. 14, 1987

[51] Int. Cl.$^5$ .............................. H01B 12/06
[52] U.S. Cl. ........................ 505/1; 252/521; 428/930; 505/742; 505/701; 505/741
[58] Field of Search ............ 505/1, 742, 701, 741; 252/521; 428/930

[56] References Cited

U.S. PATENT DOCUMENTS

| | | | |
|---|---|---|---|
| 4,994,433 | 2/1991 | Chiang | 305/741 |
| 5,041,420 | 8/1991 | Nagesh et al. | 505/742 |
| 5,145,833 | 9/1992 | Prunier, Jr. et al. | 505/742 |
| 5,145,835 | 9/1992 | Tekashita et al. | 505/1 |

FOREIGN PATENT DOCUMENTS 0088666 9/1983 European Pat. Off. .

OTHER PUBLICATIONS

Chun et al. "Superconductivity at 52.5 K: the Lanthenium-Barium-Copper-Oxide System"; Science, vol. 235 pp. 567-569, Jan. 30, 1987.
Kubo et al. "Effect of Oxygen Deficiency in the Crystal Structure and Superconducting Properties of $Ba_2Ya_3Oy$"; Japanese Journal of Applied Physics, vol. 26, No. 5 May 1987 pp. L768-L770.
Beyers, Rebl.; "Annealing Treatment Effects on Structure and Superconductivity $Y,Ba_2Cu_3O9-x$"; Solid State Physics May 27, 1987 RJ5670 (57169).
Morris, D. et al.; "Mobile Oxygen and Isotope Effect-The High Temperature Superconductor $YBL_2Cu_3O_{7-8}$"; Published in Proceeding of Symposium S of the 1987 Spring Meeting of the Materials Research Society 21-25 Apr. 1987 vol. EA-11.
Moriwaki et al.; "Superconductive Oxide Material & Production Thereof" Patent Abstracts of Japan 61-168530, vol. 10, No. 373; Dec. 12, 1986.
Yoshizaki et al, Japanese Journal of Applied Physics, vol. 26, No 4, Apr., 1987 pp. L-311-L313.
Politis et al., Z. Phys. B-Condensed Matter 66, pp. 141-146 (1987).
Clark et al, Appl. Phys. Lett. 51 (2), Jul. 13, 1987, pp. 139-141.
Kwo et al, Appl. Phys. Lett. 52 (19), May 9, 1988, pp. 1625-1627.
Davies et al, Solid State Communications, vol. 64, No. 12, pp. 1441-1444, 1987.
Young et al, Materials Research Society Symposium Proceedings, vol. 99, 1988, pp. 549-552.
Chen et al, Appl. Phys. Lett. 52 (16), Apr. 18, 1988, pp. 1355-1357.
Politis et al, Materials Research Society, Pittsburgh, Apr., 1987.
Hakuraku et al, Appl. Phys. Lett. 52 (18), May 2, 1988, pp. 1528-1530.
Tonouchi et al, Japanese Journal of Applied Physics, vol. 26, No. 4, Apr., 1987, pp. L519-L520.

Primary Examiner—Karl Group
Assistant Examiner—C. M. Bonner
Attorney, Agent, or Firm—Henry P. Sartorio; Roger S. Gaither; William R. Moser

[57] ABSTRACT

Dense superconducting ceramic oxide articles of manufacture and methods for producing these articles are described. Generally these articles are produced by first processing these superconducting oxides by ceramic processing techniques to optimize materials properties, followed by reestablishing the superconducting state in a desired portion of the ceramic oxide composite.

34 Claims, No Drawings

DENSE HIGH TEMPERATURE CERAMIC OXIDE SUPERCONDUCTORS

The United States Government has rights in this invention pursuant to Contract No. w-7405-ENG-48 between the U.S. Department of Energy and the University of California, for the operation of Lawrence Livermore National Laboratory.

This invention relates to dense high temperature ceramic oxide superconducting articles of manufacture and processes for making such articles.

BACKGROUND OF THE INVENTION

The phenomenon of superconductivity was discovered in 1911 by Kammerling and Onnes in mercury. Since that time, the phenomenon has been observed in thousands of materials, elements, alloys, inorganic and organic compound semiconductors. However, these materials are superconducting only below a critical temperature of a few degrees Kelvin. Hence, such superconducting materials required cooling by liquid helium. The attendant high expense limited the use of superconductivity to relatively exotic applications, such as accelerators for high energy physics experiments and the like.

However, Bednorz and Miller announced a dramatic breakthrough with their discovery of superconductivity at much higher temperatures in $La_{2-x}Ba_xCuO_4$. Since the publication of their discovery Chu reported superconductivity in $YBa_2Cu_3O_7$. Still others reported even higher critical transition temperatures in other similar materials.

At this point in time, there is no satisfactory theory explaining the phenomenon of superconductivity in this new class of materials which will be referred hereinafter as the ceramic oxides. It is, however, inferred from observations to date, that all these oxide superconductors exhibit a crystal structure which is a close derivative of the pervoskite lattice.

The superconducting oxides which have been found thus far invariably comprise oxides of copper, and usually barium. The third component is a rare earth or group IIIb element in a generally octahedral structure. All of the rare earths, except samarium, as well as yttrium have been found to form superconductors.

The superconducting state is extremely sensitive to the concentration of oxygen. In particular neither $YBa_2Cu_3O_6$ nor $YBa_2Cu_3O_{7.5}$ are superconducting, however, $YBa_2Cu_3O_x$, where x is between 6.5 and 7.2 and exhibits strong superconducting properties. Similarly, substitution of a few oxygen atoms with fluorine in $YBa_2Cu_3O_7$ transforms the nonsuperconducting material into one whose resistance vanishes at the remarkable temperature of approximately 280° K., according to Ovchinski.

The above implies that the superconductive state of these oxides requires a pervoskite crystal structure, slightly modified to exhibit an excess of electrons and an atomic structure which defines zero resistance pathways for excess electrons to move across the crystal.

The discovery of this new class of superconductors with critical temperatures which are certainly above the boiling point of liquid nitrogen and perhaps ultimately even above the freezing point of water will have a major impact on many technologies. However, before widespread applications can materialize major materials processing issues must be resolved. The present family of oxide superconductors are ceramics, and consequently brittle and generally difficult to form and shape. Moreover, as mentioned above, the superconducting state is sensitive to oxygen content and crystal structure, and is capable of being destroyed by improper processing environments and excessive processing temperatures. The latter parameter is a particularly serious limitation because in order to produce articles such as magnets, circuit elements or conductors, of high integrity, it is desirable to be able to achieve ceramics of high or near theoretical densities and avoid porosity. This has thus far proven to be elusive since adequate densification implies higher processing temperatures than are compatible with maintaining the superconducting state. A further issue is the desirability to produce superconductors of small cross-section in order to suppress the formation of autonomous eddy currents within the conductor.

Thus far, it has been reported, that it has been possible to form ceramic "wire" by coextruding the ceramic and a binder followed by firing. However, the porous product is extremely brittle and delicate.

It has also been recognized that it would be desirable to produce the superconductor in the form of thick layers and thin films. The formation of thin films has also been reported. In particular, superconducting films have been produced by plasma spraying on various substrates. However, it is not believed that these methods can provide films of optimal mechanical characteristics and integrity, high density, good adhesion to substrates, and satisfactory match of structural and thermal expansion parameters between films and substrates to ensure long service life under varying environmental conditions.

OBJECTS OF THE INVENTION

Accordingly, it is a principal object of the invention to provide a method of forming thick layer and thin film superconducting ceramics of high integrity, strength, and densities greater than 90 or preferably 95% of theoretical density.

Another object is to provide a method of fabricating such superconducting components, which is practical and flexible to permit production of a wide variety of shapes and patterns for electrical and magnetic circuit elements and conductors.

Yet another object of the invention is to provide superconducting films on substrates which provide high mechanical strengths and rigidity, with an excellent perfect match of structural and mechanical properties of the film and the substrate.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

The present invention provides superconducting ceramic oxides which are of high density and therefore mechanically strong. The ceramic oxide may be in the form of large bodies which are in the superconductive state throughout the entire body; superconducting thin films, as well as thick or thin superconducting surface layers securely bound with closely matching mechanical properties to dense nonsuperconducting ceramic oxide substrates.

The present process and products are the result of (1) processing superconductive ceramic materials to optimize mechanical materials parameters, notably high density in desired geometries; which invariably calls for exceeding the critical temperature leading to the destruction of the superconducting state and an insulating but "nearly superconducting" state; followed by (2) post treatment to reestablish the derivative superconducting state by a variety of methods discussed in greater detail below. It should be noted that the invention permits the production of dense superconducting stand-alone thin films and thicker layers, nonsuperconducting ceramic oxide substrates having derivative superconducting state surfaces of varying thickness, as well as ceramic oxide bodies which are superconducting throughout. This is accomplished by (1) selection of desired dimensions and geometries in the ceramic materials processing step, i.e., the choice of sizes and shapes in the densification process or subsequent cutting of the densified body; and (2) the depth or degree of conversion of the nonsuperconducting state back into its derivative superconducting phase.

The invention also provides a method for producing such superconducting articles of manufacture.

DETAILED DESCRIPTION OF THE PREFERRED EMBODIMENTS

A key feature resides in and takes advantage of the realization that the superconducting state depends rather delicately on slight compositional and structural variations from the nonsuperconducting state, and that these variations may be induced *after* the ceramic oxide has been processed, such as by hot isostatic pressing in order to optimize the mechanical properties, without regard to destroying the superconducting quality of the starting materials. This proposition appears valid for all high temperature superconducting materials, which will be referred to hereinafter as ceramic oxides. This class of superconductors includes:

$La_{2-x}M_xCuO_4$ where M = Ba, Sr, or Ca $R_1Ba_2Cu_3P_{f\pm\epsilon}$ where (R = Rare Earths)

and the above compounds with partial substitutions of O with F and possibly S, as well as undoubtedly others yet to be discovered. To illustrate, $YBa_2Cu_3O_x$, where x is in between 6.5 and 7.2, is superconducting, evidently owing to a strained orthorhombic crystal structure, with some oxygen vacancies and excess electrons able to move through the crystal along zero resistance paths, while $YBa_2Cu_3O_6$ and $YBa_2Cu_3O_{7.5}$ are insulators. The exact concentration of oxygen remains to be determined. However, while the exact concentration which makes the transition point from superconducting to nonsuperconducting remains unknown, there is no doubt that the transition exists. An important aspect is that mechanical properties such as thermal coefficients of expansion and various mechanical moduli of the closely related superconducting and nonsuperconducting phases are closely matched, so that phase boundaries between such states are strong and resistant to thermal shock or mechanical separation. For the purposes of this application, we will refer to such closely related phases as being derivatives of one another.

It is possible to reestablish the superconducting state not over the entire surface of the ceramic composite body, but only in predetermined regions or pathways only, such as by masking, blocking or selectively exposing such regions to subsequent oxygen altering processes for changing the state of the ceramic oxide material. Suitable barrier films are Cu, Ni, or noble metals.

Another alternative method for producing ceramic articles providing selected superconducting current paths relates to the selective destruction of the superconducting state in adjacent regions by methods enumerated below.

The approaches for reestablishing the superconducting state generally comprise any step which will reintroduce or remove atomic constituents lacking or in excess and which thereby render the ceramic composite nonsuperconducting. Methods to introduce atomic constituents comprise diffusion, usually by introducing lacking oxygen by exposing the nonsuperconducting solid substrate to an oxygen or fluorine atmosphere under heat and pressure and for a period of time sufficient to promote diffusion to a desired depth. The temperature history of all such process steps is required to not exceed the critical temperature at which superconducting properties are destroyed. The ceramic oxide is then cooled at relatively slow rates, approximately 100° C./hr or less. It is also possible to promote solid-solid diffusion from an atomic constituent donor substance contiguous with the desired locus of the superconducting state.

Atomic constituents may also be supplied by directed high energy beams like ion implantation.

Outward diffusion may be promoted by local heating, preferably in the presence of a getter or reactant. Such approaches are taken when reestablishment of the superconductive state requires the loss of oxygen, for example.

Approaches for the removal of the superconducting state from undesired locations include the physical removal of the superconducting ceramic material. Such methods include mechanical abrasion, grinding, sand blasting and the like, directed at the locations from which the superconducting state is to be removed, with or without protection of the desired current pathways. Other methods are chemical and electro-chemical etching. Yet another method is local heating, such as by laser, electron, and ion beams. Yet another method involves ion implantation in a destructive mode. In this context, ion implantation is used to introduce atomic species which will interfere with or poison the superconductive state.

Yet another approach is to transmit a critical atomic component by means of high energy radiation such as neutrons, protons, deutrons, alpha-particles and the like.

In general, the invention provides a method of materials processing, generally or selectively reestablishing the superconducting state, and if desired selectively destroying the superconducting state, in order to provide products which will exhibit superconducting current pathways of any desired geometry. For example, the present method offers the opportunity to produce high quality substrate chips or boards with superconducting pathways which are capable of providing leads to electrical circuit elements, which may themselves be deposited onto the chips in accordance with the practice in the computer chip and circuit board industry. For the production of such circuit boards and chips, it is particularly desirable to rely on those methods of converting superconductors to nonsuperconductors which are capable of being steered or scanned automatically. For example, laser heating as developed and practiced in laser pantography permits automated "writing" of superconducting conductor boundaries by translation of the chip with respect to the laser beam. Electron beams, ion beams, indeed ion implantation is similarly capable of being used in an automated fashion, by causing the chip or the beam focus to translate with respect to each other to produce the desired lands of superconductivity or nonsuperconductivity.

An important aspect of this invention is that it is not only applicable to producing planar superconducting current carriers, but nonplanar surfaces as well. In particular, it is contemplated to employ the present process for producing cylindrical circuit elements, especially helical or concentric coils and rings. It is particularly practical to produce electric and magnetic circuit elements of larger sizes as are used in the power industry, for example. To produce such elements, conductor boundaries and nonsuperconducting lands are formed or converted in helical fashion on solid or hollow cylinders, to provide electromagnets, magnetometers, and inductors.

Capacitors on the other hand can be provided by rendering a wafer superconducting along the edges.

Finally, it will be appreciated that chips and wafers produced in this fashion may be coated with insulating polymers and the like and deployed in stacks. Where deployed in stacks, the present invention provides methods for joining the superconducting layers in the stack by forming superconducting connecting layers across the edges of the stacks, using the same methods of forming or destroying the superconducting state.

EXAMPLE

A 300 gram green body of $YBa_2Cu_3O_7$ was prepared by blending together $BaCO_3$, $CuO$, and $Y_2O_3$ powders in stoichiometric ratio and pressing to form a green body. The green body was then fired in a furnace at 930°–950° C. for 17 hours. Thereafter the body was slowly allowed to cool in oxygen or air at a rate of about 100° C./hr or less to a temperature of about 400° C. Thereafter, the body was cooled rapidly by rapid air cooling (400° C./hr), which prevents the formation of $BaCO_3$ if cooling in air containing $CO_2$. The resulting black powder was superconducting with pervoskite like structure and chemical formula of about $YBa_2Cu_3O_{6.8}$.

This powder was then loaded into a metal container and pressurized to between about 1 and 5 atmospheres of oxygen. The pressurized container was then heated to about 750° C. before applying an external pressure to the container from the outside to about 30,000 psi. The pressures and temperatures were maintained for two hours. The container was then cooled at a rate of about 100° C./hr to room temperature yielding a dense, but nonsuperconducting ceramic of tetragonal form. This body was then cut into wafers. These wafers were then heat treated in an oxygen furnace at 650° C. under 1 atm of oxygen for 114 hours (to reintroduce oxygen and reproduce the orthorhombic form). Thereafter, the wafer was permitted to cool slowly (about 50° C./hr) to room temperature. The resulting wafers proved to be enveloped in an outer layer of superconducting phase to a depth of over 10 microns. The density of the body was 97.5% theoretical density.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A method of fabricating dense superconducting ceramic oxide articles of manufacture, which comprises the steps:
    a) treating a superconducting ceramic oxide powder with sufficient heat and sufficient pressure above atmospheric pressure to form a composite body of a density of greater than 90% which is not a superconducting structure but has nearly the composition of a superconductor, and
    b) introducing sufficient atoms selected from the group consisting of oxygen and fluorine into the structure of said composite body to transform at least the outer surface of said composite body into a superconducting state.

2. The method of claim 1, further defined in that said ceramic oxide is densified to greater than 95% theoretical density.

3. The method of claim 1 further defined in that step of transforming comprises causing said atoms to diffuse through the surface of said composite body.

4. The method of claim 3 further defined in that said atoms are caused to diffuse through the surface of said composite body from within said composite to the exterior thereof.

5. The method of claim 3 further defined in that said atoms are caused to diffuse through the surface of said composite body from the exterior to the interior thereof.

6. The method of claim 5 further defined in that said atoms are caused to diffuse through the surface of said composite body by ion implantation.

7. The method of claim 3 further defined in that said atom are caused to diffuse through the surface of said composite body by diffusion from an adjacent gas phase.

8. The method of claim 3 further defined in that said atoms are caused to diffuse through the surface of said composite body from an adjacent gas phase under heat and pressure.

9. The method of claim 8 further defined in that said gas phase is oxygen.

10. The method of claim 8 further defined in that said gas phase is fluorine.

11. The method of claim 8 further defined in that said gas phase is a combination of oxygen and fluorine.

12. The method of claim 1, wherein said ceramic oxide is selected from the group consisting of
    $La_{2-x}M_xCuO_4$ where M=Ba, Sr, or Ca,
    $RBa_2Cu_3O_x$ where R is selected from the group consisting of rare earth elements (lanthanides and Y) and Group IIIb elements, and
    the above compounds with partial substitutions of O with F or S.

13. The method of claim 1 further defined in that said ceramic oxide is $YBa_2Cu_3O_x$ where x is between 6.5 and 7.2.

14. The method of claim 1 further defined in that the composition of said body is transformed into a composition associated with the superconducting state throughout the entire body.

15. The method of claim 1 further defined in that said ceramic oxide is densified by hot isostatic pressing.

16. The method of claim 15 further defined in that said ceramic oxide is densified by hot isostatic pressing into a composite body of much larger volume than the intended end product, and that said composite body is cut into wafers of sizes corresponding to the size of said intended end product prior to transforming the nonsuperconducting state of said composite body into a superconducting state.

17. The method of claim 1 further defined by the additional step of post treatment of said composite body, in which the superconducting state is destroyed in portions of said body so as to define superconducting current pathways.

18. The method of claim 17 further defined in that said superconducting state is destroyed by selective heat treatment of said portions of said body.

19. The method of claim 18 further defined in that said selective heat treatment is carried out by means of laser heating.

20. The method of claim 18 further defined in that said selective heat treatment is carried out by electron beam heating.

21. The method of claim 18 further defined in that said selective heat treatment is carried out by charged particle beam heating.

22. The method of claim 17 further defined in that said superconducting state is destroyed by mechanical removal.

23. The method of claim 17 further defined in that said superconducting state is destroyed by selective chemical removal.

24. The method of claim 16 further defined in that said superconducting state is destroyed by chemical poisoning.

25. The method of claim 24 further defined in that said chemical poisoning is carried out by ion implantation.

26. The method of claim 13 further defined in that said ceramic oxide is densified by hot isostatic pressing at a temperature above about 750° C. for at least about 2 hours, thereafter slowly cooled in the presence of oxygen to about 400° C., followed by rapid cooling to room temperature, subsequently at least partially transformed to a superconducting state by heat treatment of the composite body in a high pressure sealed environment in the presence of oxygen.

27. An article of manufacture which comprises:
    a ceramic oxide superconductor at greater than 90% of theoretical density in the form of a thin film having a defined geometry, and
    a backing substrate comprising a non-superconducting ceramic oxide that is the same ceramic oxide as the superconducting thin film;
    wherein said ceramic oxide superconductor is contiguous with the backing substrate.

28. The article of manufacture of claim 27, wherein said ceramic oxide superconductor is selected from the group consisting of
    $La_{2-x}M_xCuO_4$ where M = Ba, Sr, or Ca,
    $RBa_2Cu_3O_x$ where R is selected from the group consisting of rare earth elements (lanthanides and Y) and Group IIIb elements, and
    the above compounds with partial substitutions of O with F or S.

29. The article of manufacture of claim 27 further defined in that said ceramic oxide superconductor is $YBa_2Cu_3O_x$, where x is between 6.5 and 7.2.

30. The article of claim 27 further defined in that said geometry of said ceramic oxide superconductor is defined by adjacent surface lands which have been rendered nonsuperconductive by selective destruction of the superconducting state.

31. The article of claim 27 further defined in that said geometry of said ceramic oxide superconductor is planar.

32. The article of claim 27 further defined in that said geometry of said ceramic oxide superconductor is nonplanar.

33. The article of claim 27 further defined in that said geometry of said ceramic oxide superconductor is cylindrical.

34. The article of claim 27 further defined in that said geometry of said ceramic oxide superconductor is helical.

* * * * *